(12) United States Patent
So et al.

(10) Patent No.: US 11,875,493 B2
(45) Date of Patent: Jan. 16, 2024

(54) VIBRATOR UNIT, CONVEYING SYSTEM, AND CONVEYING METHOD

(71) Applicant: SYNAX Co., LTD., Matsumoto (JP)

(72) Inventors: Vincent So, San Francisco, CA (US); Takeshi Furukawa, Azumino (JP); Cosmos Chong, Matsumoto (JP)

(73) Assignee: Synax Co., Ltd.

( * ) Notice: Subject to any disclaimer, the term of this patent is extended or adjusted under 35 U.S.C. 154(b) by 535 days.

(21) Appl. No.: 17/131,141

(22) Filed: Dec. 22, 2020

(65) Prior Publication Data

US 2021/0201467 A1 Jul. 1, 2021

Related U.S. Application Data

(63) Continuation of application No. PCT/JP2020/016213, filed on Apr. 10, 2020.

(30) Foreign Application Priority Data

Dec. 26, 2019 (JP) .................................. 2019-236185

(51) Int. Cl.
*G06T 7/00* (2017.01)
*B06B 3/00* (2006.01)
(Continued)

(52) U.S. Cl.
CPC .............. *G06T 7/0002* (2013.01); *B06B 3/00* (2013.01); *B25J 9/1697* (2013.01);
(Continued)

(58) Field of Classification Search
CPC ...... G06T 7/0002; B25J 9/1697; G10K 15/00; B06B 1/045; B06B 3/00; G05B 19/41815; H05K 13/028; B65G 54/00
See application file for complete search history.

(56) References Cited

U.S. PATENT DOCUMENTS 4,712,974 A  12/1987  Kane
6,056,108 A * 5/2000  Buchi .................... B25J 9/1697
198/395
(Continued)

FOREIGN PATENT DOCUMENTS

CA   2975015 A1  8/2016
CN   102901920 A  1/2013
(Continued)

OTHER PUBLICATIONS

Berse et al "Assembly Device", Mar. 22, 2006, EP 1637280 A1 (Year: 2006).*

(Continued)

*Primary Examiner* — Sang H Nguyen
(74) *Attorney, Agent, or Firm* — Harness, Dickey & Pierce, P.L.C.

(57) ABSTRACT

A vibrator unit comprises a vibrating plate having a first surface on which a target object is arranged and a second surface on a side opposite to the first surface, a base arranged with a certain interval from the vibrating plate, a speaker having a vibrating portion opposed to the second surface and a frame connected to the base, and a transfer member transferring vibration of the speaker to the vibrating plate.

10 Claims, 9 Drawing Sheets

(51) Int. Cl.
    *G05B 19/418*     (2006.01)
    *G10K 15/00*     (2006.01)
    *B25J 9/16*     (2006.01)
    *H05K 13/02*     (2006.01)
    *B65G 54/00*     (2006.01)

(52) U.S. Cl.
    CPC ....... *G05B 19/41815* (2013.01); *G10K 15/00* (2013.01); *H05K 13/028* (2013.01); *B65G 54/00* (2013.01)

(56) References Cited

U.S. PATENT DOCUMENTS

| | | | |
|---|---|---|---|
| 2003/0141165 A1 | 7/2003 | Reznik et al. | |
| 2008/0274241 A1* | 11/2008 | Steuer | A23G 1/30 426/231 |
| 2011/0174593 A1 | 7/2011 | Mazzini | |
| 2018/0273311 A1* | 9/2018 | Berse | B65G 69/04 |

FOREIGN PATENT DOCUMENTS

| | | |
|---|---|---|
| CN | 205855295 U | 1/2017 |
| CN | 107257715 A | 10/2017 |
| CN | 108370407 A | 8/2018 |
| CN | 208679859 U | 4/2019 |
| CN | 110562675 A | 12/2019 |
| EP | 916457 A2 | 5/1999 |
| EP | 3250490 A1 | 12/2017 |
| JP | H04107998 U | 9/1992 |
| JP | H09-77230 A | 3/1997 |
| JP | 3172494 B2 | 6/2001 |
| JP | 3899581 B2 | 3/2007 |
| JP | 2009120397 A | 6/2009 |
| JP | 2018506488 A | 3/2018 |
| KR | 10-2018-0006708 A | 1/2018 |
| TW | 200530101 A | 9/2005 |
| TW | 200734665 A | 9/2007 |
| WO | 2016120439 A1 | 8/2016 |
| WO | 2019/097650 A1 | 5/2019 |

OTHER PUBLICATIONS

JP H04107998 U, Sep. 17, 1992 (Year: 1992).*
Taiwanese Office Action for Application No. 109116092, dated May 31, 2021 with English translation (19 pages).
Chinese Office Action dated Jun. 6, 2022 for Application No. 202080003322.5 with English translation (20 pages).

* cited by examiner

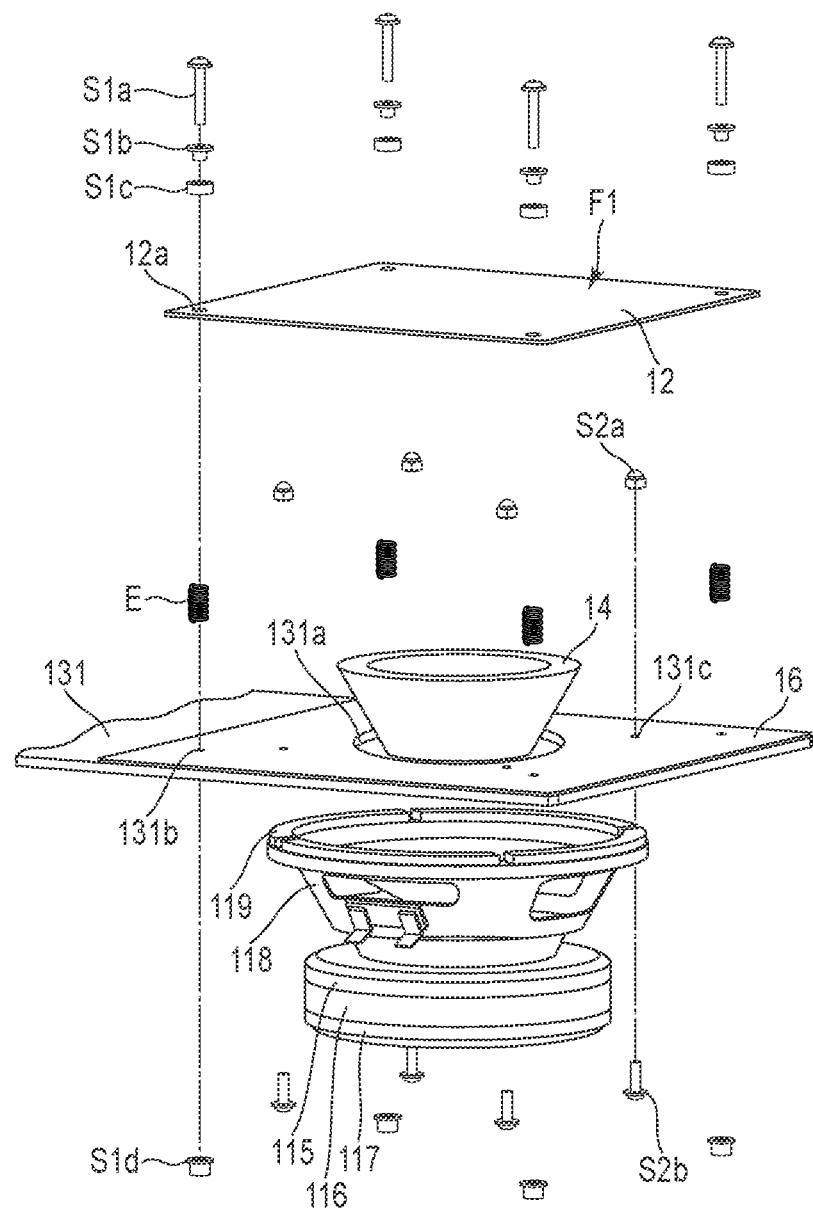
F I G. 5

VIBRATOR UNIT, CONVEYING SYSTEM, AND CONVEYING METHOD

CROSS-REFERENCE TO RELATED APPLICATIONS

This application is a Continuation Application of PCT Application No. PCT/JP2020/016213, filed Apr. 10, 2020 and based upon and claiming the benefit of priority from prior Japanese Patent Application No. 2019-236185, filed Dec. 26, 2019, the entire contents of all of which are incorporated herein by reference.

BACKGROUND OF THE INVENTION

1. Field of the Invention

The present invention relates to a vibrator unit, a conveying system using the vibrator unit, and a conveying method.

2. Description of the Related Art

Electric tests have been conventionally performed in a process of manufacturing electronic components. To perform electric tests, the electronic components need to be prepared in an attitude suitable for the tests. However, the electronic components are often supplied in a random state on an inspection table. For this reason, a step of changing the attitude of the electronic components by turning the electronic components upside down or rotating the electronic components before the test is required.

A mechanism using, for example, a bowl (casing where the electronic components are put) is known as a mechanism for changing the attitude of the electronic components. A mechanism using a bowl vibrates the bowl by transmitting eccentric vibration caused by rotation of an electric motor serving as a vibration source to the bowl, and turns the electronic components in the bowl upside down or rotates the electronic components by using the vibration.

In the mechanism using the bowl, however, bowls corresponding to the sizes and shapes of the electronic component need to be prepared, and labor is required for exchange of bowls and adjustment of the device after the exchange. Furthermore, since the bowl itself is a precisely processed custom-made product, the bowl is a very expensive part.

BRIEF SUMMARY OF THE INVENTION

Embodiments described herein aim to provide a vibrator unit that is hardly influenced by the sizes and shapes of the electronic components and that is capable of changing the electronic components to a desired attitude, a conveying system using the vibrator unit, and a conveying method.

A vibrator unit of the embodiments comprises: a vibrating plate having a first surface on which a target object is arranged and a second surface on a side opposite to the first surface; a base arranged with a certain interval from the vibrating plate; a speaker having a vibrating portion opposed to the second surface and a frame connected to the base; and a transfer member transferring vibration of the speaker to the vibrating plate.

The vibrator unit may further comprise an elastic member supporting the vibrating plate, between the vibrating plate and the base.

The base may have an opening portion, and the transfer member may be in contact with the second surface of the vibrating plate through the opening portion.

The conveying system of the embodiments comprises the vibrator unit, and a transfer conveying a target object arranged on the first surface of the vibrating plate.

The conveying system may further comprise a camera and a control device. The control device may have a capturing module configured to capture a designated area on the first surface by the camera; an image identification module configured to recognize a state of the target object in the designated area based on a captured image, and to identify the target object as a target object in a first state or a second state; and a conveyance control module configured to allow the target object identified as a target object in the first state to be conveyed by the transfer.

The control device may have a vibration control module configured to output a signal to vibrate the vibrating portion to the vibrator unit when the target object in the first state does not exist and the target object in the second state exists in the designated area.

In the conveying system, the first state may be a state in which a designated surface of the target object faces upwardly from the first surface, and the second state may be a state in which a surface different from the designated surface of the target object faces upwardly from the first surface.

A conveying method of the embodiments comprises: arranging a plurality of target objects on a first surface of a vibrating plate having the first surface and a second surface on a side opposite to the first surface; conveying the target objects in a first state arranged on the first surface from the first surface; and vibrating the vibrating plate by a speaker having a vibrating portion opposed to the second surface, and changing the target object in a second state arranged on the first surface to the first state.

The conveying method may further comprise capturing a designated area on the first surface by the camera, and recognizing a state of the target object in the designated area based on a captured image, and identifying the target object as a target object in the first state or the second state. The target object identified as a target object in the first state may be conveyed from the first surface.

In the conveying method, when the target object in the first state does not exist and the target object in the second state exists in the designated area, the vibrating plate is vibrated by the speaker.

In the conveying method, the first state may be a state in which a designated surface of the target object faces upwardly from the first surface, and the second state may be a state in which a surface different from the designated surface of the target object faces upwardly from the first surface.

Embodiments described herein aim to provide a vibrator unit that is hardly influenced by the sizes and shapes of the electronic components and that is capable of changing the electronic components to a desired attitude, a conveying system using the vibrator unit, and a conveying method.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodi

FIG. 5 is an exploded view showing the vibrator unit according to the first embodiment.

DETAILED DESCRIPTION OF THE INVENTION

Embodiments will be described hereinafter with reference to the accompanying drawings.

In each of the embodiments, a vibrator unit, a conveying system, and a conveying method assumed to be used mainly in a process of manufacturing electronic components are disclosed. In each drawing, relative sizes and locations of the respective members constituting the conveying system are often illustrated schematically. Incidentally, the present invention is not limited by the embodiments described below.

First Embodiment

Figure 1:
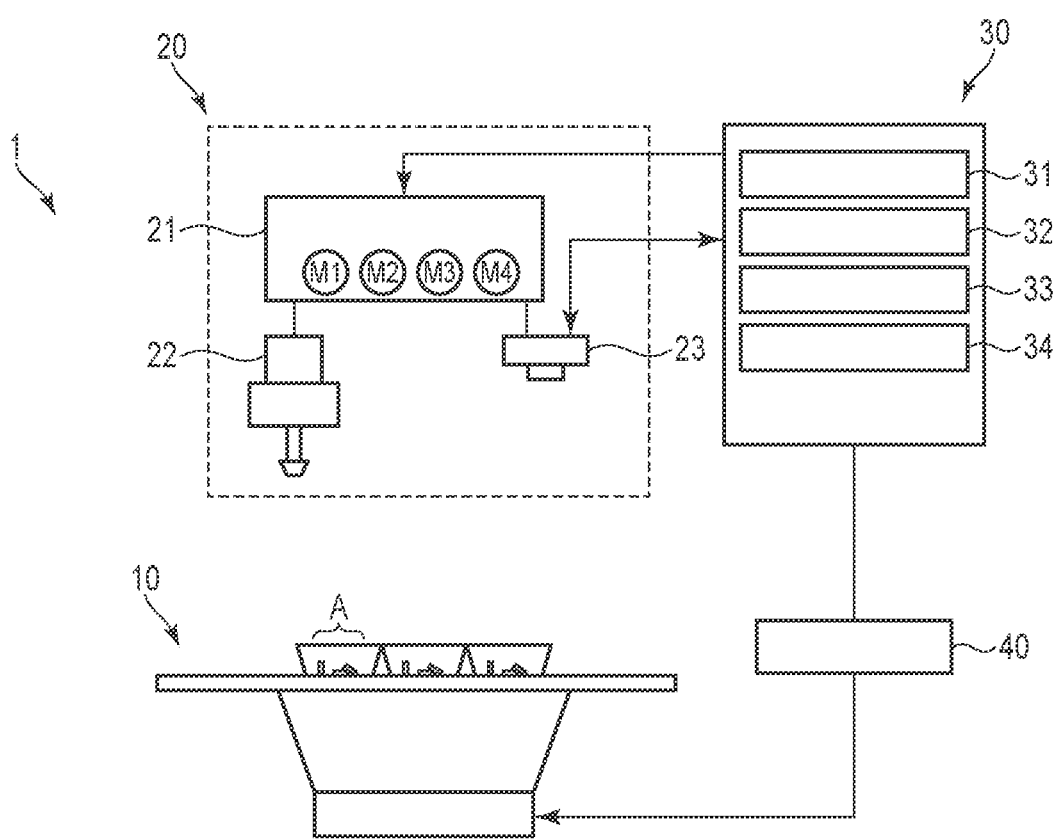
- FIG. 1 is a diagram showing a schematic configuration of a conveying system according to a first embodiment.

FIG. 1 is a diagram showing a schematic configuration of a conveying system 1 according to a first embodiment. The conveying system 1 comprises a vibrator unit 10, a transfer 20, a control device 30, and an amplifier 40. The vibrator unit 10 is connected to the control device 30 via the amplifier 40, and the transfer 20 is communicably connected to the control device 30. The control device 30 controls each of the vibrator unit 10 and the transfer 20.

Electronic components A are arranged on the vibrator unit 10. The electronic components A are examples of target objects. The electronic components A are, for example, ICs.

The transfer 20 is so called a multi-axis horizontal conveyance robot. The transfer 20 comprises a drive mechanism 21, an adsorbing nozzle 22, and a camera 23. Each of the drive mechanism 21 and the camera 23 is connected to the control device 30. The drive mechanism 21 comprises a plurality of motors M1 to M4. The camera 23 is illustrated as a part of the transfer 20. However, the camera 23 may be installed separately from the transfer 20.

The camera 23 is arranged to capture the electronic components A on the vibrator unit 10. The captured imaging data is output to the control device 30.

The control device 30 includes a capturing module 31, an image identification module 32, a conveyance control module 33, and a vibration control module 34.

The capturing module 31 controls the camera 23 to capture a designated area of the vibrator unit 10. The designated area is a range in which the electronic components A on the vibrator unit 10 are arranged or, for example, a range corresponding to a housing space SP to be described later. The image identification module 32 recognizes a state of the electronic component A in the designated area by performing image processing of the imaging data captured by the camera 23. Then, the state of the electronic component A is identified based on preset criteria. The conveyance control module 33 controls the transfer 20 to convey the identified electronic component A to an inspection device (not shown). The inspection device is, for example, a device for inspecting electric characteristics of the electronic component A. The inspection device may be the other device that is not included in the conveying system 1 or may be an inspection stage in the system.

The vibration control module 34 outputs a signal to urge the vibrator unit 10 to generate vibration. When the signal is output from the vibration control module 34, the signal is input to the amplifier 40. The signal input to the amplifier 40 is converted and amplified in the amplifier 40, and output to the vibrator unit 10. The signal output from the amplifier 40 is output to a speaker 11 to be described later, which the vibrator unit 10 includes. The speaker 11 vibrates in accordance with the signal output from the amplifier 40.

The conveying system 1 may be defined as a system including elements other than the constituent elements shown in FIG. 1. Alternatively, the conveying system 1 may be configured as an independent system or may be incorporated as a part of the other system.

Figure 2:
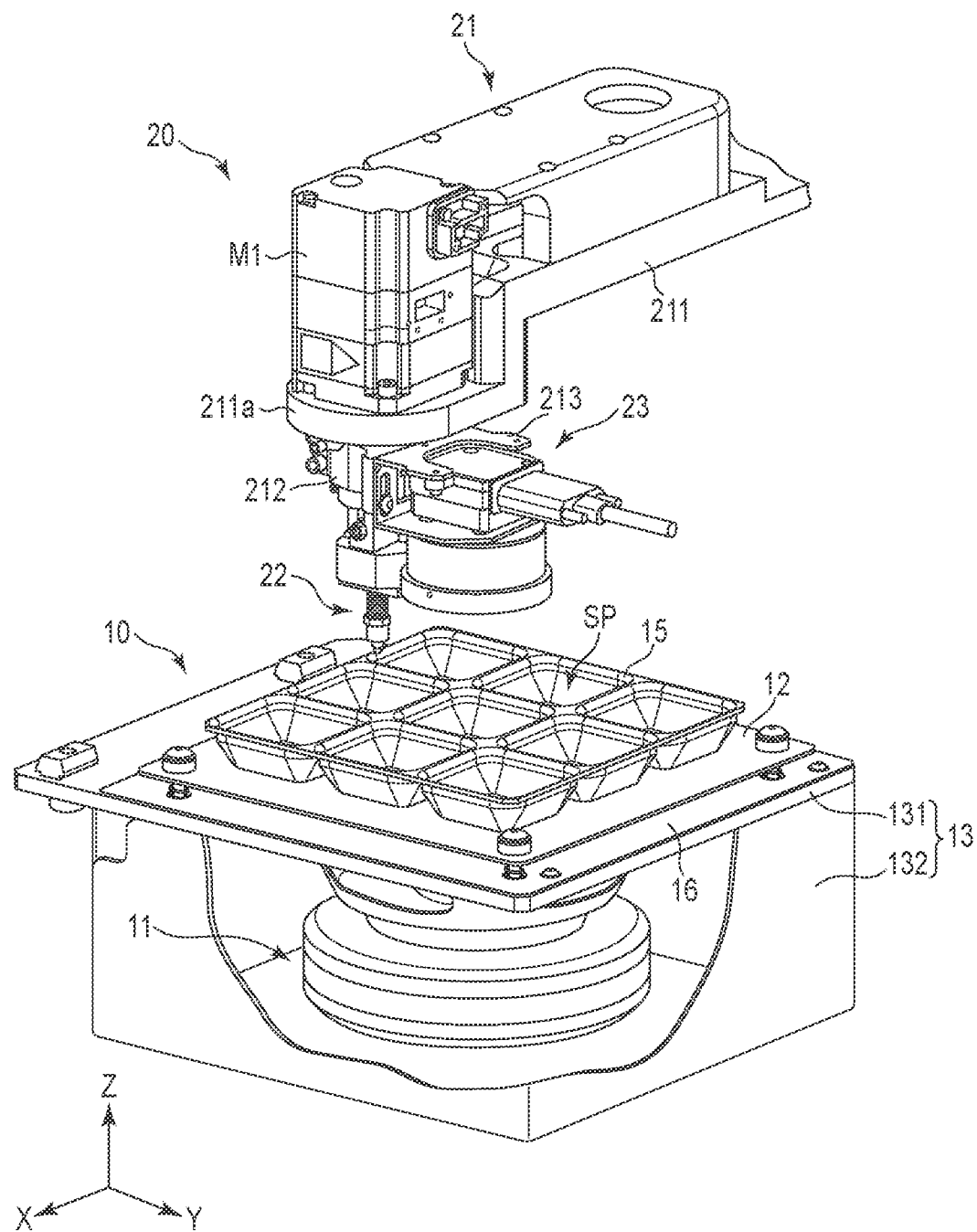
FIG. 2 is a schematic perspective view showing the conveying system according to the first embodiment.

FIG. 2 is a schematic perspective view showing the conveying system 1 according to the present embodiment. FIG. 2 shows the vibrator unit 10 and the transfer 20 as the main constituent elements of the conveying system 1. Directions on planes parallel to a vibrating plate 12 that the vibrator unit 10 comprises are referred to as X direction and Y direction, respectively. A thickness direction, i.e., a perpendicular direction, of the vibrating plate 12 is referred to as Z direction.

The drive mechanism 21 of the transfer 20 comprises a crank-like arm 211. A motor M1 is arranged above a distal part 211a of the arm 211. A shaft of the motor M1 extends to a lower side of the distal part 211a through an opening provided in the distal part 211a, and the adsorbing nozzle 22 is attach to the part extending downward. Furthermore, a fixing instrument 212 is attached to the shaft of the motor M1 located between the distal part 211a and the adsorbing nozzle 22. The fixing instrument 212 may be attached to a part other than the shaft of the motor M1. A bracket 213 on which the camera 23 is to be mounted is attached to a side surface of the fixing instrument 212.

The drive mechanism 21 comprises the above-described motors M2 to M4, the other arms, etc., in addition to the arm 211 and the motor M1. For example, the drive mechanism 21 may comprise a horizontal drive mechanism that makes the arm 211 pivot in a multi-axis manner around an axis parallel to the Z direction by the motors M2 and M3. Alternatively, the drive mechanism 21 may comprise a vertical drive mechanism that moves up and down the arm 211 parallel to the Z direction by the motor M4.

In the transfer 20, the adsorbing nozzle 22 and the camera 23 are located above the vibrator unit 10 and arranged with a certain interval so as not to interfere with the vibrator unit 10. This interval is variable according to the motion of the transfer 20. The transfer 20 can move the adsorbing nozzle 22 and the camera 23 in each of the horizontal directions (X direction and Y direction) and the perpendicular direction (Z direction) to the vibrator unit 10, by the drive mechanism 21.

In addition, the transfer 20 can convey the electronic component A adsorbed by the adsorbing nozzle 22 to an inspection device (not shown).

Figure 3:
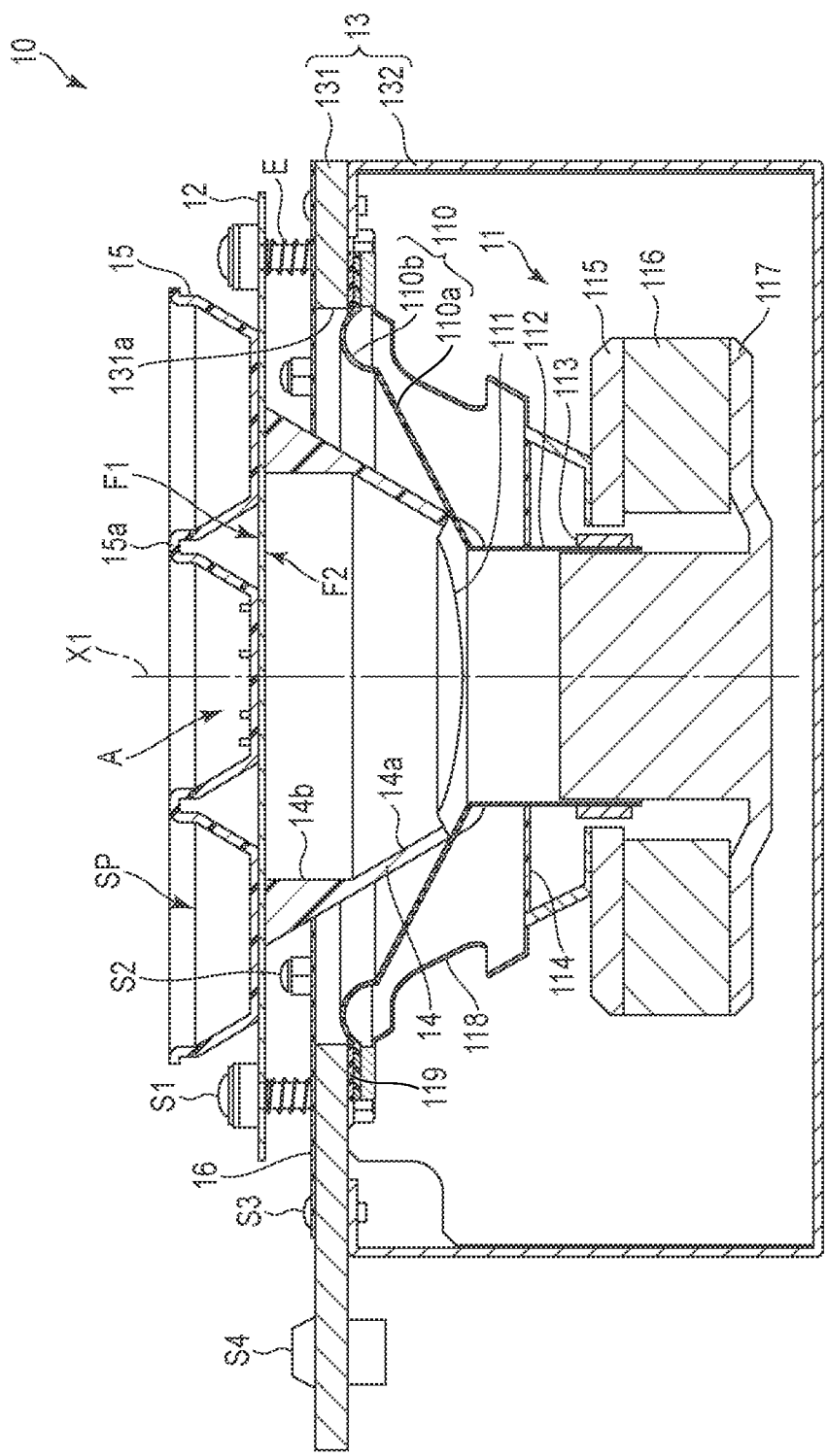
FIG. 3 is a schematic cross-sectional view showing a vibrator unit according to the first embodiment.

Next, each of the constituent elements of the conveying system 1 will be described. FIG. 3 is a schematic cross-sectional view showing the vibrator unit 10 according to the present embodiment. The vibrator unit 10 includes a speaker 11, the vibrating plate 12, a base 13, a cone 14, a tray 15, and a sheet 16.

The speaker 11, which is a vibration source of the vibrator unit 10, will be described. The speaker 11 includes a vibration member 110, a dust cap 111, a voice coil bobbin 112, a voice coil 113, a dumper 114, a top plate 115, a magnet 116, a yoke 117, a frame 118, and a gasket 119. Axis X1 is a central axis of the speaker 11. The axis X1 and the Z direction in FIG. 2 are parallel to each other. The vibration member 110, the dust cap 111, the voice coil bobbin 112, the voice coil 113, and the dumper 114 are included in a vibrating portion of the speaker 11.

The vibration member 110 includes a vibration member body 110a and an edge part 110b. An inner peripheral part of the vibration member body 110a is connected to the cylindrical voice coil bobbin 112. An outer peripheral part of the vibration member body 110a is connected to an edge part 110b that has a partially curved part. An outer peripheral part of the edge part 110b is connected to the frame 118. The vibration member body 110a is formed of, for example, a resin material.

The voice coil 113 is formed on a lower end side of an outer peripheral surface of the voice coil bobbin 112. The dumper 114 is located between the voice coil bobbin 112 and the frame 118. An outer peripheral part of the dumper 114 is connected to the frame 118, and an inner peripheral part of the dumper 114 is connected to the voice coil bobbin 112. The voice coil bobbin 112 is supported to vibrate in a direction parallel to the axis X1 by the vibration member 110 and the dumper 114. In addition, the dust cap 111 is connected to the vibration member 110 so as to cover an opening part of an upper surface of the voice coil bobbin 112.

A magnetic circuit is constituted by overlaying the top plate 115, the magnet 116, and the yoke 117 along the axis X1. A certain gap is formed between inner peripheral surfaces of the top plate 115 and magnet 116 and an outer peripheral surface of a central part of the yoke 117. The voice coil bobbin 112 is arranged such that the voice coil 113 is located in the gap.

A lower surface of the frame 118 fixed to an upper surface of the top plate 115. In the present embodiment, the frame 118 is assumed to be a metal frame. A terminal (not shown) is arranged on an outer peripheral surface of the frame 118, and the terminal and the voice coil 113 are connected to each other.

The operation of the speaker 11 starts when the signal is input from the amplifier 40 to the voice coil 113 via the terminal. When the signal is input to the voice coil 113, the voice coil 113 receives a force in the vertical direction, which is a direction parallel to the axis X1, and the voice coil bobbin 112 and the voice coil 113 move. Then, the vibration member 110 connected to the voice coil bobbin 112, and the dust cap 111 connected to the vibration member 110 are vibrated to follow the movement of the voice coil bobbin 112. When the vibration member 110 and the like are vibrated, air around the vibration member 110 is vibrated and a sound is generated.

The vibrating plate 12 is shaped in a thin plate and has a first surface F1 on a side on which the electronic components A are arranged, and a second surface F2 on a side opposite to the first surface F1. The vibrating plate 12 is arranged parallel to the base 13 with a certain interval disposed therebetween and is supported by fastening members S1 so as to be vibrated. A position of the center of the vibrating plate 12 and the axis X1 are located coaxially. The vibrating plate 12 can be formed of, for example, a metal material such as aluminum.

The base 13 includes a base plate 131 and a housing 132. The housing 132 shaped in a box which opens to an upper side. The base plate 131 is a plate-like member which is thicker than the vibrating plate 12, and the base plate 131 closes the opening of the housing 132. The base plate 131 can be formed of, for example, a metal material such as aluminum. The base plate 131 includes a circular opening portion 131a. An axis of the center of the opening portion 131a of the base plate 131 and the axis X1 are located coaxially. Elastic members E to be described later are arranged between the vibrating plate 12 and the base plate 131. The vibrating plate 12 is supported by the elastic members E.

The speaker 11 is accommodated in the housing 132. The speaker 11 is fixed to the base plate 131 by fastening members S2 such that the vibrating portion is opposed to the second surface F2. Alternatively, the speaker 11 may be fixed to the housing 132. The base plate 131 and the housing 132 are fixed by fastening members S3.

The cone 14 is a transfer member to transfer the vibration generated at the speaker 11 to the vibrating plate 12. The cone 14 is located between the speaker 11 and the vibrating plate 12, and is arranged to pass through the opening portion 131a of the base plate 131. The axis of the center of the cone 14 and the axis X1 are located coaxially. That is, the speaker 11, the vibrating plate 12, the opening portion 131a, and the cone 14 of the vibrator unit 10 are arranged coaxially with the axis X1.

The cone 14 is tapered such that its outer shape extends to the vibrating plate 12. In addition, the cone 14 includes a cavity formed of a tapered part 14a and a cylindrical part 14b. A lower end part of the cone 14 is in contact with the speaker 11. An upper end part of the cone 14 is in contact with the second surface F2 of the vibrating plate 12. The lower end part of the cone 14 may be in contact with the vibration member 110, the dust cap 111, or both of them. Contact portions of the cone 14, the speaker 11, and the vibrating plate 12 may be bonded to each other. In the present example, the cone 14 is manufactured of a resin material but may be manufactured of the other material.

The vibration generated from the speaker 11 is transmitted to the vibrating plate 12 not only via the cone 14, but by vibrating air in the cavity of the cone 14.

The tray 15 is arranged on the first surface F1 of the vibrating plate 12. The tray 15 is a container on which the electronic components A are arranged, but the electronic components A may be arranged directly on the first surface F1 without using the tray 15. The arrangement of the electronic components A on the tray 15 is performed by an operator's manual work or a robot. The tray 15 is arranged on the first surface F1 by bonding or fastening member. The tray 15 includes a partition 15a in directions along the X direction and the Y direction in FIG. 2. The interior of the tray 15 is divided into a plurality of accommodation spaces SP by the partition 15a. Each of the accommodation spaces SP is desirably smaller than a range which can be recognized by the camera 23. For example, the accommodation spaces SP may be arranged in a matrix in the X direction and the Y direction as shown in FIG. 2.

The partition 15a of the tray 15 is tapered such that a cross-sectional area in the horizontal direction (X-Y plane) of each accommodation space SP becomes smaller toward the bottom surface. By thus forming the side surface of the accommodation space SP in a tapered shape, the adsorbing nozzle 22 and the tray 15 can hardly be brought into contact with each other when the electronic component A located near the side surface is adsorbed by the adsorbing nozzle 22.

The sheet 16 is arranged on the upper surface of the base plate 131 to cover a part of the opening portion 131a of the base plate 131. By arranging the sheet 16, garbage such as dust can be prevented from being deposited on the vibration member 110 of the speaker 11. This is because when garbage is deposited on the vibration member 110, the movement of the vibration member 110 is interrupted and the vibration of the speaker 11 is affected.

Openings and notches are provided at positions corresponding to the respective components so as not to interfere with the cone 14 and the fastening members, on the sheet 16. The sheet 16 may be fixed to the base plate 131 by the fastening members S3 or may be bonded directly on the base plate 131.

The base 13 includes fixing members S4. The vibrator unit 10 can be mounted on the other device by using the fixing members S4. The vibrator unit 10 may be mounted on the other device or may be an independent unit.

Figure 4:
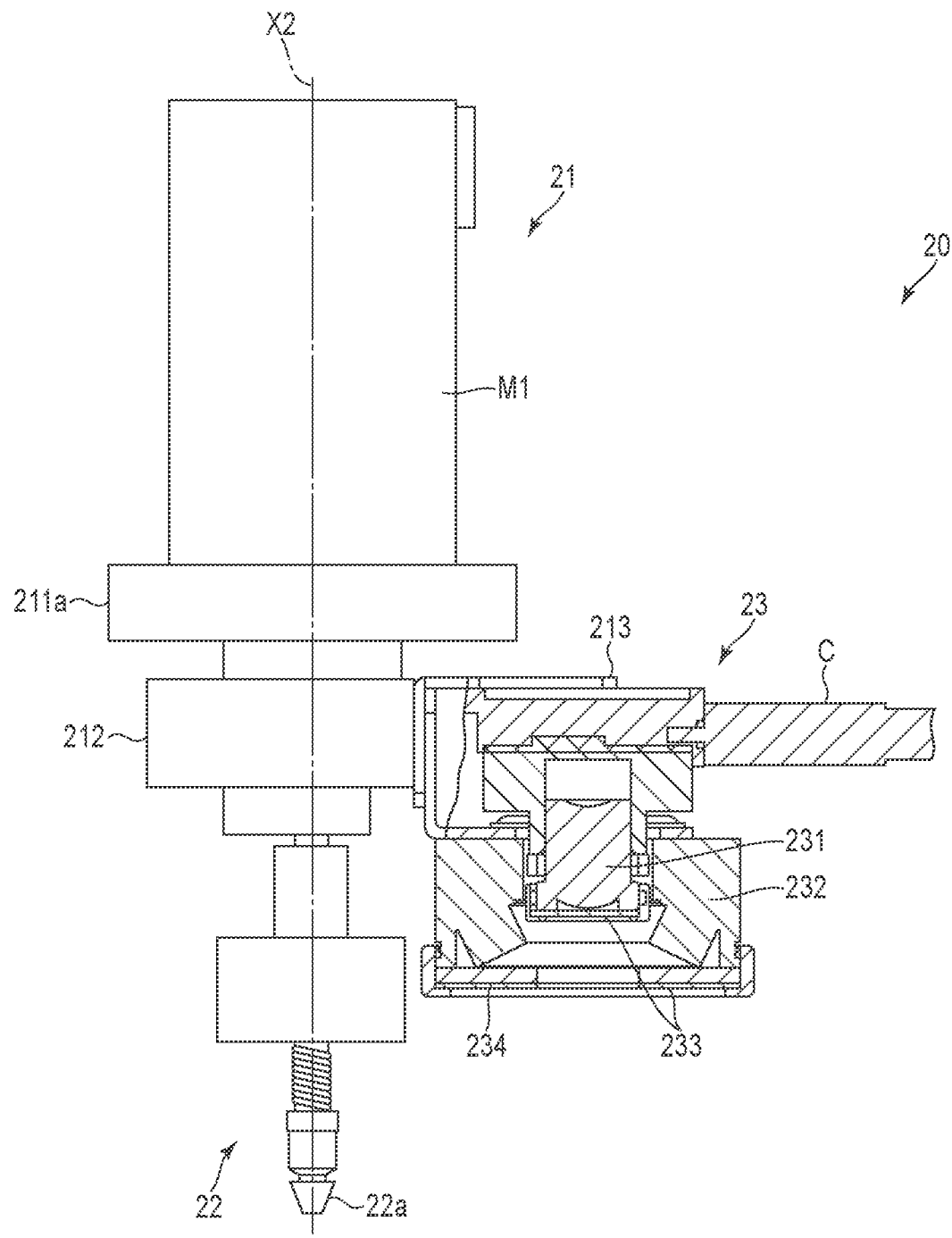
FIG. 4 is a schematic cross-sectional view showing a transfer according to the first embodiment.

FIG. 4 is a schematically and partially cross-sectional view showing the transfer 20 according to the present embodiment. When the above-described motor M1 is driven, the fixing instrument 212 is rotated about a rotation axis X2 of the motor M1. The adsorbing nozzle 22 is mounted on a distal end of the fixing instrument 212. The axis of center of the adsorbing nozzle 22 matches the rotation axis X2 of the motor M1.

The adsorbing nozzle 22 can be rotated and the camera 23 can be moved in cooperation with the drive of the motor M1. Alternatively, the movement of the camera may not be in cooperation with the drive of the motor M1. When the motor M1 is rotated in a state in which the electronic component A is adsorbed by the adsorbing nozzle 22, the attitude of the electronic component A can be changed.

The adsorbing nozzle 22 includes a vacuum pad 22a at its distal end. The vacuum pad 22a can be changed in accordance with the size and shape of the electronic component A to be adsorbed. The drive mechanism 21 comprises a mechanism for decompressing the inside of the adsorbing nozzle 22. When the vacuum pad 22a approaches the electronic component A in a state where the inside of the adsorbing nozzle 22 is decompressed by this mechanism, the electronic component A is adsorbed by the vacuum pad 22a.

The camera 23 captures a designated area of the vibrating plate 12. The captured data is transmitted to the control device 30 via a cable C. The camera 23 includes a lens 231, an illumination unit 232, a polarizing filter 233, a diffusion plate 234, and an imaging element (not shown). The imaging element is, for example, an image sensor such as CCD. The lens 231 is attached to face the vibrating plate 12. The illumination unit 232 emits light to the designated area of the vibrating plate 12. The diffusion plate 234 which diffuses the light emitted from the illumination unit 232 is attached to the illumination unit 232. The illumination unit 232 is, for example, a ring-shaped light on which LEDs are arranged radially. The polarizing filter 233 is attached to each of the lens 231 and the illumination unit 232.

FIG. 5 is an exploded view showing the vibrator unit 10 according to the present embodiment. In FIG. 5, several parts of the vibrator unit 10 are omitted. Connection of the components of the vibrator unit 10 will be described.

First, the vibrating plate 12 and the base plate 131 are fastened by a plurality of fastening members S1. The fastening member S1 has a bolt S1a, a bush S1b, a washer S1c, and a nut S1d.

The vibrating plate 12 has, for example, through holes 12a at four corners. The base plate 131 has through holes 131b provided at positions corresponding to the through holes 12a. The bolts S1a are inserted into the through holes 12a and 131b from the first surface F1 side of the vibrating plate 12 and screwed into the nuts S1d on the lower surface side of the base plate 131. The bushes S1b and the washers S1c are located between heads of the bolts S1a and the first surface F1 of the vibrating plate 12.

Elastic members E are located between the vibrating plate 12 and the base plate 131. The bolts S1a penetrate the elastic members E. The elastic members E are, for example, coil springs. The elastic members E are compressed to be shorter than a natural length by being sandwiched between the vibrating plate 12 and the base plate 131. The urging force of the elastic members E urges the vibrating plate 12 to be pressed against the heads of the bolts S1a. In this structure, the vibrating plate 12 is fixed to the base plate 131 so as to be vibrated by the fastening members S1. The interval between the vibrating plate 12 and the base plate 131 is desirably approximately 10 mm.

The washers S1c are formed of, for example, a foam (sponge). Selection of a foam as the material of the washers S1c has an effect of damping the vibration the vibrating plate 12 when the vibration transmitted to the vibrating plate 12 is stopped.

The frame 118 of the speaker 11 is fixed to the base plate 131 by the fastening members S2. The fastening member S2 has a nut S2a and a bolt S2b. The base plate 131 further includes through holes 131c. The bolts S2b are inserted into through holes provided at end parts of the frame 118 and the through holes 131c of the base plate 131 from the lower surface side of the frame 118, and screwed into the nuts S2a on the upper surface side of the base plate 131.

In addition, the gasket 119 is located between the frame 118 and the base plate 131. The gasket 119 is annularly arranged on the upper end surface of the frame 118. The frame 118 and the base plate 131 are fixed in a state in which the gasket 119 is sandwiched and crushed between the frame 118 and the base plate 131.

Figure 6:
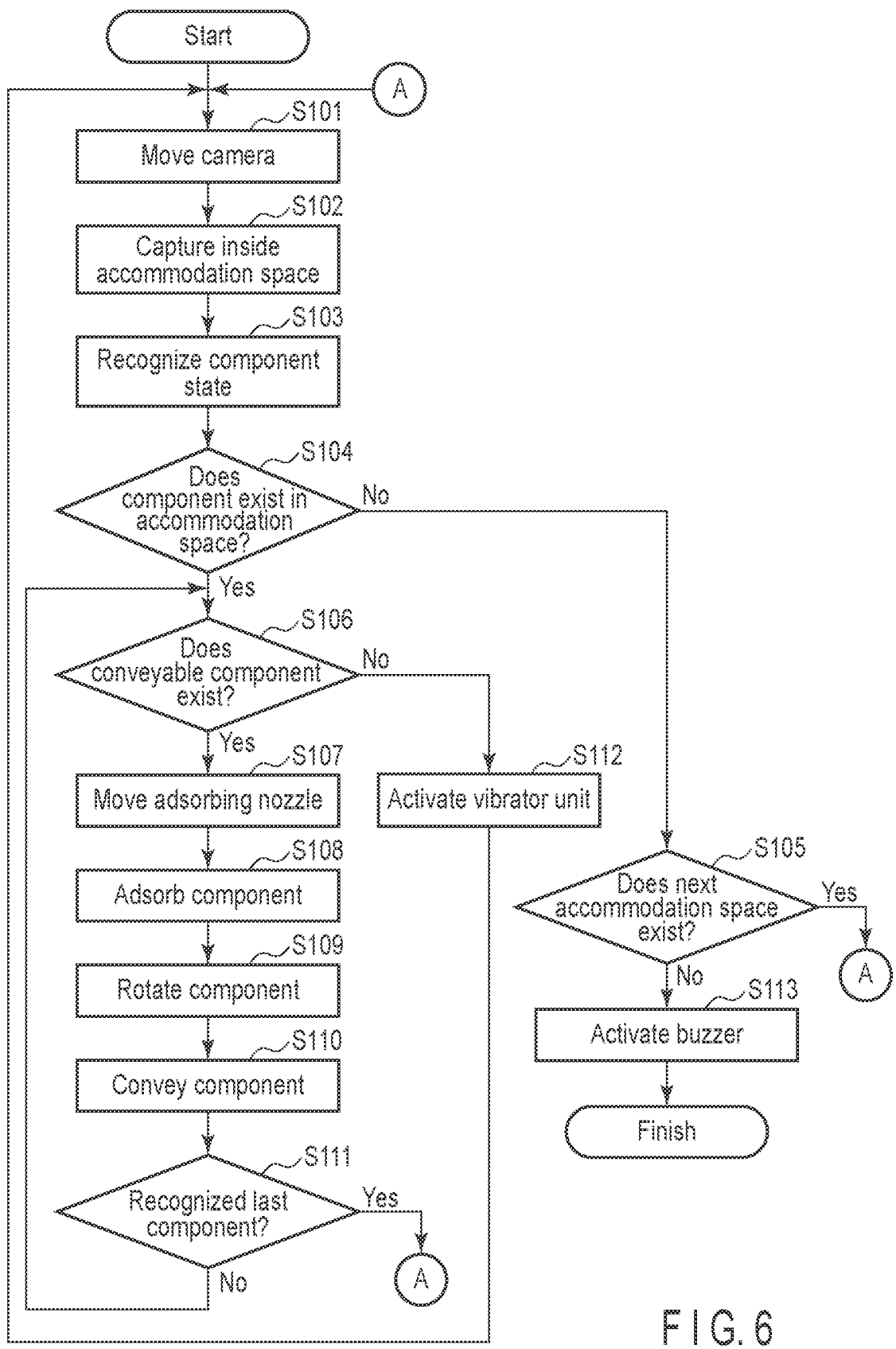
FIG. 6 is a flowchart showing an example of operations of the conveying system according to the first embodiment.

FIG. 6 is a flowchart showing an example of operations (conveying method) of the conveying system 1 according to the present embodiment. Operations indicated by this flowchart are executed by the control device 30. The control device 30 includes a computer composed of a processor, a memory and the like. For example, the processor which the control device 30 comprises executes the computer program stored in the memory, and the above-described capturing module 31, image identification module 32, conveyance control module 33, and vibration control module 34 are thereby implemented. The execution of the computer program may be implemented by using a plurality of processors. In addition, at least one of the modules 31 to 34 may be an individual device independent of the control device 30.

First, a plurality of electronic components A are arranged in the accommodation spaces SP in the tray 15 (arrangement step). The arrangement of the electronic components A in the accommodation spaces SP may be arranged manually by the worker or may be arranged by a robot. The operation of the conveying system 1 is started after the electronic components A are arranged in the tray 15.

The control device 30 outputs a signal to the drive mechanism 21 of the transfer 20, and moves the camera 23 above any one of the accommodation spaces SP of the tray 15 on the vibrating plate 12 (step S101). After the camera 23 is moved, the capturing module 31 allows the accommodation spaces SP to be captured by the camera 23 (step S102: capturing step). At this time, the capturing data generated by the camera 23 is transmitted to the image identification module 32.

After the capturing data is transmitted to the image identification module 32, the image identification module 32 recognizes states of the electronic components A, based on the images obtained from the capturing data (step S103: image identification step). More specifically, the image identification module 32 recognizes the position information and angle information of the electronic components A and recognizes whether the electronic components A are in a first state or a second state, based on the images obtained from the capturing data. The state of the image identification using the image identification module 32 will be shown in FIG. 7 to be described later. The position information is, for example, coordinates on the vibrating plate 12. The angle information is an angle at which the electronic component A is rotated relatively in the direction to a referential position. The referential position is a position at which, for example, the electronic component A on the inspection device, i.e., the conveyance destination of the electronic component A, is arranged. The first state is a state in which a designated surface of the electronic component A faces upward above the first surface F1 of the vibrating plate 12 (in the Z direction), and the second state is a state in which a surface different from the designated surface of the electronic component A faces upward above the first surface F1 of the vibrating plate 12. The designated surface is, for example, a surface which needs to face upward at the inspection at the inspection device.

Besides, the image identification module 32 may recognize information on defects of the electronic components A. The information on the defects of the electronic components A are, for example, shapes such as deformation and scratches of the electronic components A, attachment of foreign materials, printing state, and the like.

The image identification module 32 determines whether the electronic component A recognized in step S103 exists (step S104). When the electronic component A recognized exists (Yes in step S104), the image identification module 32 determines whether the electronic component A which can be conveyed by the adsorbing nozzle 22 exists (step S106). This determination is performed based on comparison between the state of the electronic component A based on the image obtained from the capturing data and a determination criterion. For example, when the conveyable state is determined as the first state as the determination criterion, the only electronic component A in the first state is determined as conveyable and the electronic component A in the second state is determined as unconveyable. Whether the conveyable state is set to the first state or the second state is determined in advance. The determination criterion may be stored in the control device 30.

When the conveyable electronic component A exists according to the determination result of the image identification module 32 (Yes in step S106), the conveyance control module 33 moves the adsorbing nozzle 22 above the conveyable electronic component A, based on the position information of the electronic component A recognized in step S103 (step S107). After moving the adsorbing nozzle 22, the conveyance control module 33 moves the adsorbing nozzle 22 down to the electronic component A and urges the adsorbing nozzle 22 to adsorb the electronic component A (step S108). After adsorbing the electronic component A, the conveyance control module 33 drives the motor M1 of the drive mechanism to rotate the electronic component A in a determined direction, based on the angle information of the electronic component A recognized in step S103 (step S109). After rotating the electronic component A, the conveyance control module 33 conveys the electronic component A to the inspection device (step S110: conveyance step).

After conveying the electronic component A, the control device 30 determines whether the conveyed component is the last electronic component A, of the electronic components A recognized in step 103 (step S111). When the conveyed component is not the last electronic component A (No in step S111), the process returns to step S106. In contrast, when, after conveying the electronic component A, the conveyed component is the last electronic component A recognized in step 103 (Yes in step S111), the process returns to step S101. For example, when the electronic components A overlap, the electronic component A of the lower side is not recognized by the image identification module 32. After the electronic component A of the upper side is conveyed, the electronic component A of the lower side may be left in the accommodation space SP in a state of being unrecognized. By capturing the inside of the accommodation space SP again after conveying the recognized last electronic component A, the electronic components A can be prevented from being left.

For example, at least one or more electronic components A can be recognized in step S103. When all the electronic components A are in the second state, it is determined in step S106 that no conveyable electronic component A exists (No in step S106). At this time, the vibration control module 34 activates the vibrator unit 10 (step S112: vibration step). More specifically, the vibration control module 34 outputs the signal to the amplifier 40. The amplifier 40 amplifies this signal and outputs the signal to the vibrator unit 10. The speaker 11 of the vibrator unit 10 vibrates the vibrating plate 12 in accordance with the signal from the amplifier 40. At this time, the electronic components A in the tray 15 are also vibrated. The amplifier 40 may amplify the signal within a predetermined range or may be controlled by the control device 30.

The vibration time of the vibrator unit 10 is determined in advance. The signal output from the vibration control module 34 includes elements such as a waveform, a frequency and an amplitude. The waveform is, for example, a rectangular wave, but may be a sine wave or a saw tooth wave. By using the signal having each element optimized in accordance with the shape and the size of the electronic component A, the vibrator unit 10 alone can correspond to various types of electronic components.

By operating the vibrator unit 10, the electronic components A in the tray 15 can be turned upside down or rotated. When a plurality of electronic components A are arranged at random the electronic components A may be overlaid. However, the electronic components A can be separated from each other by giving the vibration.

For example, it is assumed that the electronic component A is shaped in a rectangular parallelepiped of 1.0 mm×1.0 mm×0.6 mm. In this case, to turn the electronic component A upside down, it is desirable to set a waveform of the vibration to a rectangular wave, set the vibration time to 0.1 seconds or more and 1 second or less, and set the frequency to 30 Hz or more and 50 Hz or less.

After activating the vibrator unit 10, the flow returns to step S101 again. These steps are repeated until the electronic components A disappear in the accommodation spaces SP. When the electronic components A disappear in the accommodation space SP (No in step S104), it is determined whether a next accommodation space SP that is not a process target of steps S101 to S112 exists (step S105). When the next accommodation space SP exists (Yes in step S105), the processes following step S101 are executed by using the accommodation space SP as a target. This operation is repeated until the accommodation space SP that is not the process target disappears.

When the accommodation space SP that is not the process target disappears after the above flow is repeated (No in step S105), the control device 30 activates a buzzer (step S113). By activating the buzzer, it is possible to notify the operator of the conveying system that the electronic component A to be conveyed disappears on the tray 15. Then, the operation of the conveying system 1 is finished in step S113.

Figure 7:
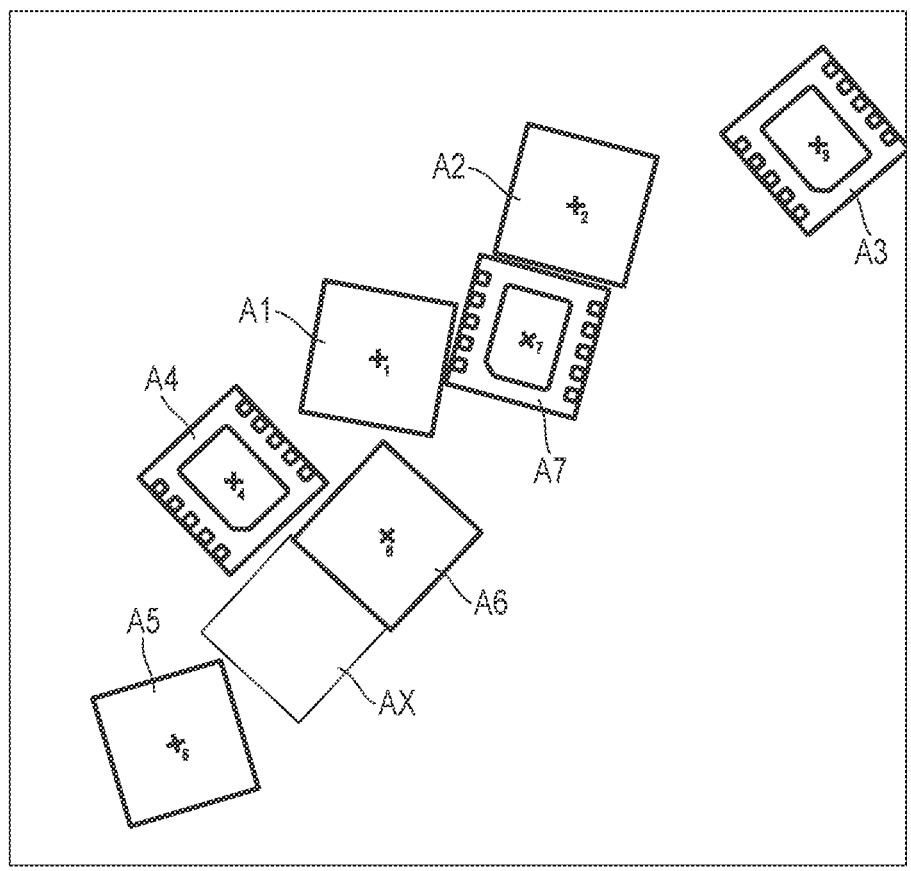
FIG. 7 is a schematic diagram showing a state of image recognition in the conveying system according to the first embodiment.

FIG. 7 is a schematic diagram showing a state of image recognition in the conveying system 1 according to the present embodiment. FIG. 7 shows a result of recognition of the image identification module 32 based on the image obtained from the capturing data acquired by the capturing module 31. This result may be output to, for example, an image display device such as a liquid crystal monitor and the operator may confirm the result.

In FIG. 7, shapes of the recognized electronic components A are represented by thick lines. In addition, the positions of centers of the recognized electronic components A are recognized and numbers are assigned to the electronic components. As a result of the recognition performed by the image identification module 32, a plurality of electronic components A1 to A7 are recognized.

For example, in FIG. 7, a state of the electronic component A1 is referred to as a first state, and a state of the electronic component A3 is referred to as a second state. The electronic component A1, the electronic component A2, the electronic component A5, and the electronic component A6 are in the first state, and the electronic component A3, the electronic component A4, and the electronic component A7 are in the second state. According to the determination criterion by which the first state is considered as a conveyable state, the electronic component A1, the electronic component A2, the electronic component A5, and the electronic component A6 are conveyed to the inspection device at the conveyance control module 33. Then, the electronic component A in the second state can be turned and its attitude can be changed to the first state in which the electronic component A is conveyable, by activating the vibrator unit 10.

In the example of FIG. 7, an electronic component AX partially overlaid on the electronic component A6 exists under the electronic component A6. Since a part of an outline of the electronic component AX is hidden, the electronic component cannot be recognized correctly in the image. When overlaying the electronic components A6 and AX is solved by giving the vibration by the vibrator unit 10, the electronic component AX can be recognized at the image identification module 32.

As described above, the conveying system 1 of the present embodiment changes the attitudes of the electronic components A by giving the vibration to the electronic components A on the vibrating plate 12 by the speaker 11. In such a structure, as compared with a conventional mechanism using a bowl, since preparation of parts corresponding to the sizes and shapes of the electronic components A is unnecessary, labor of component replacement and device adjustment can be saved.

In addition, in a case where the electronic components A need to be conveyed in a state in which a specific surface faces upwardly, similarly to the present embodiment, the electronic components A can easily be turned upside down by giving the vibration by the speaker 11 even if the electronic components A having the surface facing downwardly exist.

Furthermore, the vibrating plate 12 cannot only be supported stably, but the vibrating plate 12 can be supported in a state of being capable of vibrating in accordance with the vibration transmitted from the cone 14, by providing the elastic member E between the vibrating plate 12 and the base 13. In addition, since the cone 14 is in contact with the second surface F2 of the vibrating plate 12, the vibration of the speaker 11 is transmitted via the cone 14 in the thickness direction (vertical direction) of the vibrating plate 12. When the direction of vibration of the vibrating plate 12 is the vertical direction, the electronic components A jump upwardly and the change of the attitudes in the first state and the second state can easily occur.

Second Embodiment

A second embodiment will be described. The same reference numerals are denoted to the same constituent elements as those of the first embodiment and their descriptions are optionally omitted.

Figure 8:
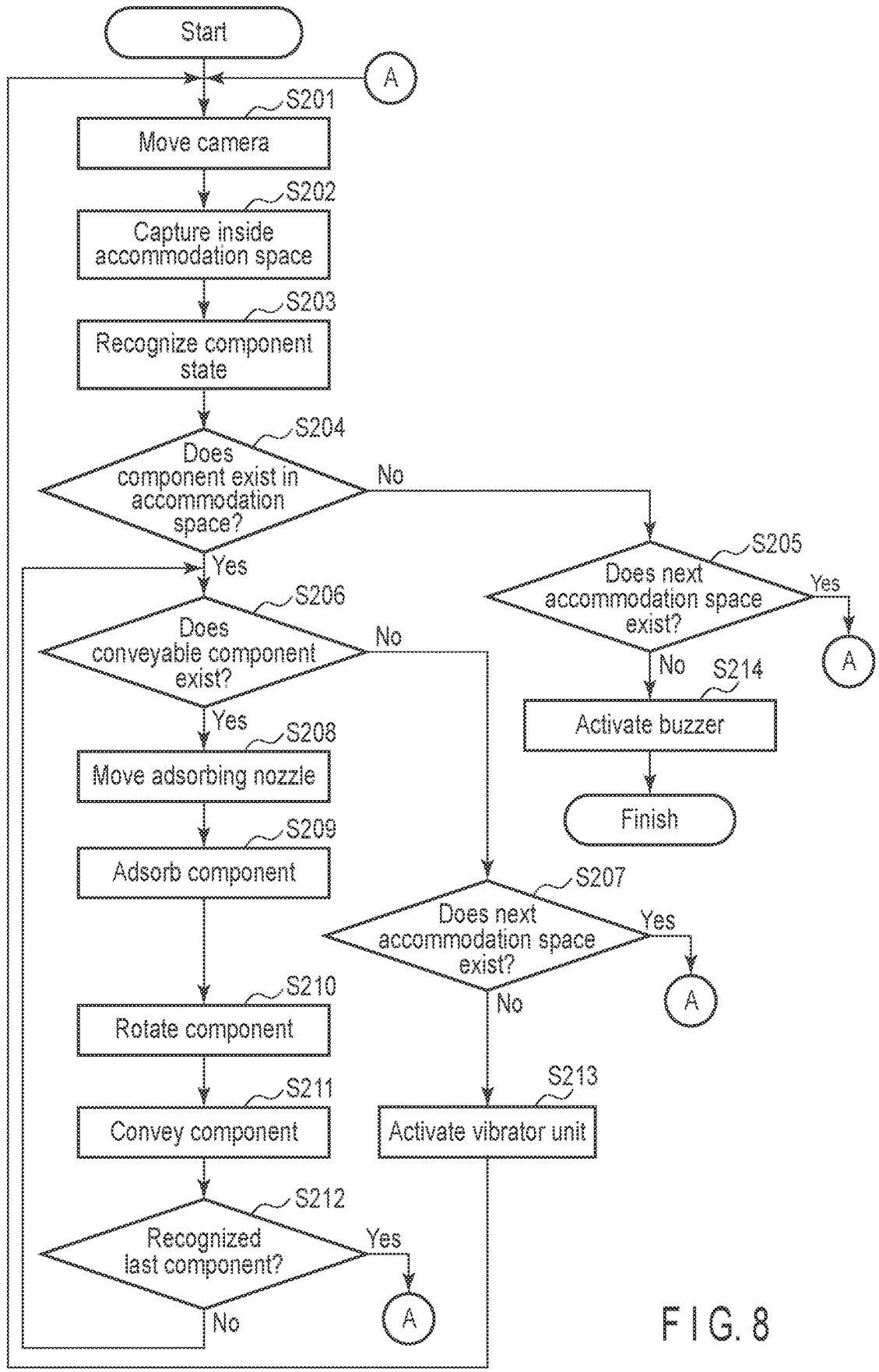
FIG. 8 is a flowchart showing an example of operations of a conveying system according to a second embodiment.

FIG. 8 is a flowchart showing an example of operations of the conveying system 1 according to the second embodiment. First, a plurality of electronic components A are arranged in the accommodation spaces SP in the tray 15. The operation of the conveying system 1 is started after the electronic components A are arranged in the tray 15.

The control device 30 outputs a signal to the drive mechanism 21 of the transfer 20, and moves the camera 23 above any one of the accommodation spaces SP of the tray 15 on the vibrating plate 12 (step S201). After the camera 23 is moved, the capturing module 31 allows the accommodation spaces SP to be captured by the camera 23 (step S202). At this time, the capturing data generated by the camera 23 is transmitted to the image identification module 32.

After the capturing data is transmitted to the image identification module 32, the image identification module 32 recognizes states of the electronic components A, based on the images obtained from the capturing data (step S203). The contents of recognition of the image identification module 32 are the same as those in the first embodiment.

The image identification module 32 determines whether the electronic component A recognized in step S203 exists (step S204). When the electronic component A recognized exists (Yes in step S204), the image identification module 32 determines whether the electronic component A which can be conveyed by the adsorbing nozzle 22 exists (step S206).

When the conveyable electronic component A exists according to the determination result of the image identification module 32 (Yes in step S206), the conveyance control module 33 moves the adsorbing nozzle 22 above the conveyable electronic component A, based on the position information of the electronic component A recognized in step S203 (step S208). After moving the adsorbing nozzle 22, the conveyance control module 33 moves the adsorbing nozzle 22 down to the electronic component A and urges the adsorbing nozzle 22 to adsorb the electronic component A (step S209). After adsorbing the electronic component A, the conveyance control module 33 drives the motor M1 of the drive mechanism to rotate the electronic component A in a determined direction, based on the angle information of the electronic component A recognized in step S203 (step S210). After rotating the electronic component A, the conveyance control module 33 conveys the electronic component A to the inspection device (step S211).

After conveying the electronic component A, the control device 30 determines whether the conveyed component is the last electronic component A, of the electronic components A recognized in step 203 (step S212). When the conveyed component is not the last electronic component A (No in step S212), the process returns to step S206. In contrast, when, after conveying the electronic component A, the conveyed component is the last electronic component A recognized in step 203 (Yes in step S212), the process returns to step S201.

When one or more electronic components A that can be recognized in step S203 exist and all the electronic components A are not conveyable (No in step S206), the control device 30 determines whether a next accommodation space SP exists (step S207). When a next accommodation space SP exists (Yes in step S207), the flow returns to step S201 again and the next accommodation space SP is captured. When it is determined in step S204 that the electronic component A does not exist in the accommodation spaces SP (No in step S204), too, the control device 30 determines whether a next accommodation space SP exists (step S205), and when a next accommodation space SP exists (Yes in step S205) the flow returns to step S201 again.

When such operations are repeated, all conveyable electronic components (for example, electronic components A in the first state) of a plurality of electronic components A arranged in the respective accommodation spaces SP of the tray 15 are conveyed to the inspection device. The unconveyable electronic component A (for example, electronic component A in the second state) or electronic component A that cannot be recognized in the image is left in each accommodation space SP.

When a next accommodation space SP does not exist in step S207 (No in step S207), i.e., when the conveyable electronic components A disappear in the respective accommodation spaces SP of the tray 15, the vibration control module 34 activates the vibrator unit 10 (step S213). Thus, when unconveyable electronic components A exist in the respective accommodation spaces SP, the attitudes of these electronic components A are changed by turning upside down. After activating the vibrator unit 10, the flow returns to step S201 again.

When the above operations are repeated and then the electronic components A cannot be recognized in any accommodation spaces SP immediately after the vibrator unit is activated (No in step S205), the control device 30 activates the buzzer (step S214). By activating the buzzer, it is possible to notify the operator of the conveying system 1 that the electronic component A to be conveyed disappears on the tray 15. Then, the operation of the conveying system 1 is finished in step S214.

In the second embodiment, the vibrator unit 10 is activated after all the conveyable electronic components A are conveyed from the respective accommodation spaces SP of the tray 15. Since the vibrator unit 10 is activated in a state in which the number of the electronic components A on the tray 15 is reduced, an influence to the electronic components A caused by the vibration such as contact of the electronic components A can be reduced.

In the second embodiment, the designated area may be the whole first surface F1 of the vibrating plate 12. When the designated area is the whole first surface F1 of the vibrating plate 12, the step of confirming the accommodation space SP is unnecessary in the flowchart. Contribution to the reduction in the processing time can also be expected by reducing the number of times of capturing using the camera 23.

Third Embodiment

A third embodiment will be described. The same reference numerals are denoted to the same constituent elements as those of each the above embodiments and their descriptions are optionally omitted.

Figure 9:
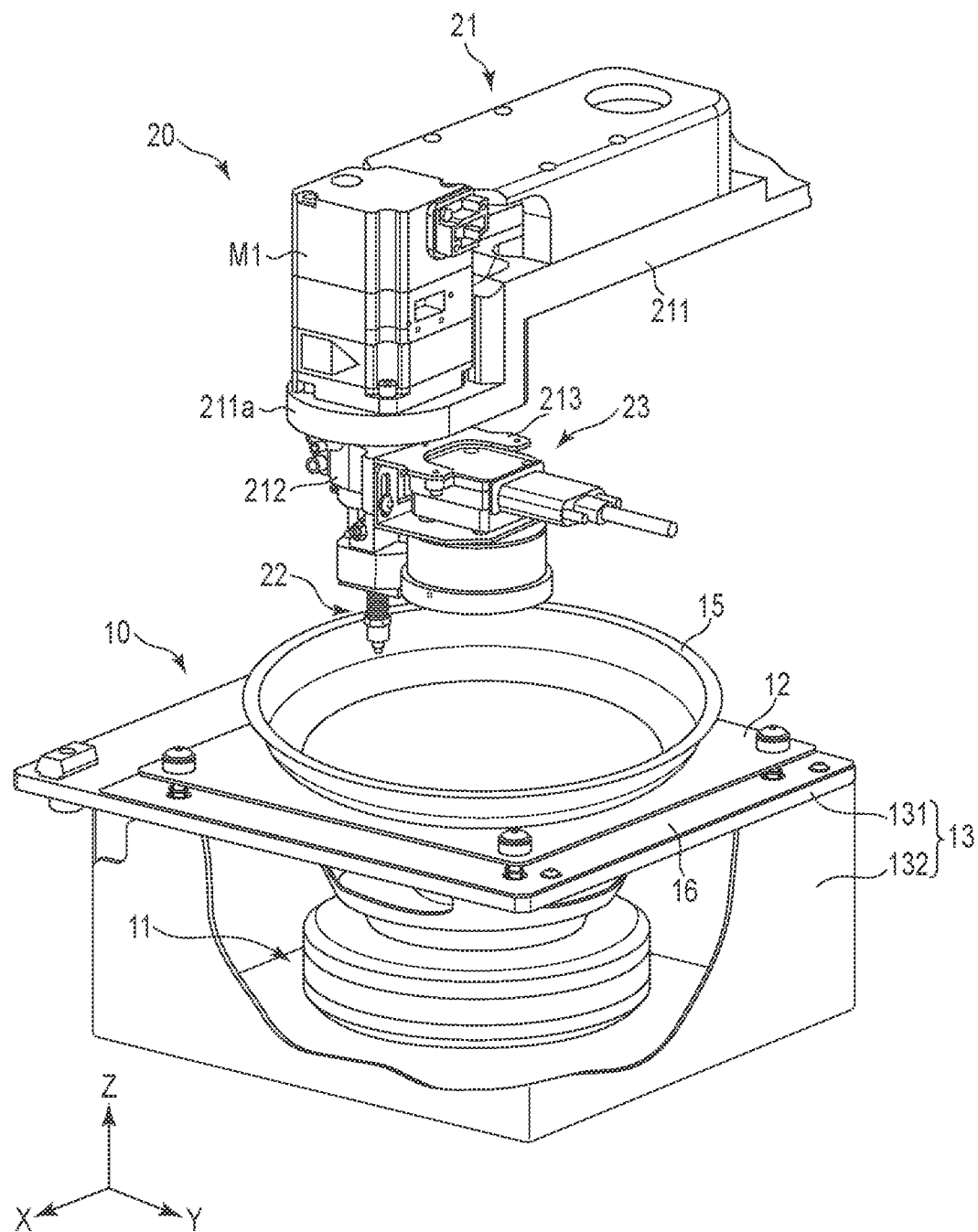
FIG. 9 is a schematic perspective view showing a conveying system according to a third embodiment.

FIG. 9 is a schematic perspective view showing a conveying system 1 according to the third embodiment. The conveying system 1 shown in this figure is different from the conveying system 1 shown in FIG. 2 with respect to a feature that the tray 15 has a circular shape and is not divided into a plurality of accommodation spaces SP.

The conveying system 1 of the present embodiment can be operated in the flow described with reference to FIG. 6 in the first embodiment. In this case, capturing using the camera 23 may be performed while dividing an upper part of the tray 15 into a plurality of view field ranges (designated areas) arrayed in a matrix. That is, any one of the view field ranges is captured in step S102, it is determined in step S104 whether the electronic component A exists in the view field range, and it is determined in step S105 whether a next view field range that is not the processing target exists.

In addition, the conveying system 1 of the present embodiment can also be operated in the flow described with reference to FIG. 8 in the second embodiment. In this case, too, capturing using the camera 23 may be performed while dividing the upper part of the tray 15 into a plurality of view field ranges (designated areas) arrayed in a matrix. That is, any one of the view field ranges is captured in step S202, it is determined in step S204 whether the electronic component A exists in the view field range, and it is determined in steps S205 and S207 whether a next view field range that is not the processing target exists.

In the structure of the conveying system 1 of the present embodiment, too, the same advantages as those of the first and second embodiments can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A vibrator unit comprising:
a vibrating plate having a first surface on which a target object is arranged and a second surface on a side opposite to the first surface;
a base which includes a base plate comprising an upper surface opposed to the second surface and is arranged with a certain interval from the vibrating plate;
a speaker having a vibrating portion opposed to the second surface, and a frame connected to a lower surface of the base plate;
a transfer member transferring vibration of the speaker to the vibrating plate so as to vibrate the target object arranged on the first surface of the vibrating plate; and an elastic member supporting the vibrating plate between the vibrating plate and the upper surface of the base plate.

2. The vibrator unit of claim 1, wherein
the base plate has an opening portion, and
the transfer member is in contact with the second surface of the vibrating plate through the opening portion.

3. A conveying system comprising:
the vibrator unit of claim 1; and
a transfer conveying the target object arranged on the first surface of the vibrating plate.

4. The conveying system of claim 3, further comprising:
a camera; and
a control device,
wherein
the control device has:
a capturing module configured to capture a designated area on the first surface by the camera;
an image identification module configured to recognize a state of the target object in the designated area based on a captured image, and to identify the target object as a target object in a first state or a second state; and
a conveyance control module configured to allow the target object identified as a target object in the first state to be conveyed by the transfer.

5. The conveying system of claim 4, wherein
the control device has a vibration control module configured to output a signal to vibrate the vibrating portion to the vibrator unit when the target object in the first state does not exist and the target object in the second state exists in the designated area.

6. The conveying system of claim 4, wherein
the first state is a state in which a designated surface of the target object faces upwardly from the first surface, and the second state is a state in which a surface different from the designated surface of the target object faces upwardly from the first surface.

7. A conveying method comprising:
arranging a plurality of target objects on a first surface of a vibrating plate having the first surface and a second surface on a side opposite to the first surface;
conveying the target objects in a first state arranged on the first surface from the first surface; and
vibrating the vibrating plate by transferring vibration of the speak included in the vibrator unit of claim 1 to the vibrating plate by the transfer member, and changing the target object in a second state arranged on the first surface to the first state.

8. The conveying method of claim 7, further comprising:
capturing a designated area on the first surface by the camera; and
recognizing a state of the target object in the designated area based on a captured image, and identifying the target object as a target object in the first state or the second state,
wherein
the target object identified as a target object in the first state is conveyed from the first surface.

9. The conveying method of claim 8, wherein
when the target object in the first state does not exist and the target object in the second state exists in the designated area, the vibrating plate is vibrated by the speaker.

10. The conveying method of claim 7, wherein
the first state is a state in which a designated surface of the target object faces upwardly from the first surface, and
the second state is a state in which a surface different from the designated surface of the target object faces upwardly from the first surface.

* * * * *